(12) United States Patent
Jung et al.

(10) Patent No.: US 9,030,893 B2
(45) Date of Patent: May 12, 2015

(54) WRITE DRIVER FOR WRITE ASSISTANCE IN MEMORY DEVICE

(71) Applicant: QUALCOMM Incorporated, San Diego, CA (US)

(72) Inventors: Changho Jung, San Diego, CA (US); Nishith Desai, San Diego, CA (US); Rakesh Vattikonda, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/760,988

(22) Filed: Feb. 6, 2013

(65) Prior Publication Data

US 2014/0219039 A1    Aug. 7, 2014

(51) Int. Cl.

| | |
|---|---|
| *G11C 7/00* | (2006.01) |
| *G11C 7/12* | (2006.01) |
| *G11C 8/08* | (2006.01) |
| *G11C 11/419* | (2006.01) |
| *G11C 11/408* | (2006.01) |
| *G11C 5/14* | (2006.01) |

(52) U.S. Cl.
CPC .............. *G11C 7/12* (2013.01); *G11C 11/4085* (2013.01); *G11C 7/00* (2013.01); *G11C 5/14* (2013.01); *G11C 8/08* (2013.01); *G11C 11/419* (2013.01)

(58) Field of Classification Search
CPC .............. G11C 7/00; G11C 7/12; G11C 8/08; G11C 11/4085; G11C 5/14

USPC ......... 365/154, 155, 156, 226, 227, 228, 229, 365/189.16, 230.06
See application file for complete search history.

(56) References Cited

U.S. PATENT DOCUMENTS

| | | |
|---|---|---|
| 7,512,030 B2 | 3/2009 | Houston et al. |
| 7,835,217 B1 | 11/2010 | Su et al. |

(Continued)

OTHER PUBLICATIONS

Karl E., et al., "A 4.6GHz 162Mb SRAM Design in 22nm Tri-Gate CMOS Technology with Integrated Active VMIN-Enhancing Assist Circuitry", IEEE ISSCC, Session 13 / High-Performance Embedded SRAM / 13.1, 2012, pp. 230-232.

Kulkarni, et al., Capacitive-Coupling Wordline Boosting with Self-Induced VCC Collapse for Write VMIN Reduction in 22-nm 8T SRAM, IEEE ISSCC, 2012, pp. 234-236.

(Continued)

*Primary Examiner* — Ly D Pham
(74) *Attorney, Agent, or Firm* — Haynes and Boone, LLP

(57) ABSTRACT

A write assist driver circuit is provided that assists a memory cell (e.g., volatile memory bit cell) in write operations to keep the voltage at the memory core sufficiently high for correct write operations, even when the supply voltage is lowered. The write assist driver circuit may be configured to provide a memory supply voltage VddM to a bit cell core during a standby mode of operation. In a write mode of operation, the write assist driver circuit may provide a lowered memory supply voltage $VddM_{lower}$ to the bit cell core as well as to at least one of the local write bitline (lwbl) and local write bitline bar (lwblb). Additionally, the write assist driver circuit may also provide a periphery supply voltage VddP to a local write wordline (lwwl), where $VddP \geq VddM > VddM_{lower}$.

12 Claims, 10 Drawing Sheets

(56) References Cited

U.S. PATENT DOCUMENTS

| | | |
|---|---|---|
| 8,064,271 B2 | 11/2011 | Houston |
| 8,223,536 B2 | 7/2012 | Tonomura et al. |
| 2008/0055967 A1* | 3/2008 | Houston et al. ............... 365/154 |
| 2009/0251984 A1* | 10/2009 | Jung et al. .................... 365/226 |
| 2010/0027360 A1 | 2/2010 | Maiti et al. |
| 2012/0044779 A1 | 2/2012 | Chuang et al. |
| 2014/0003132 A1* | 1/2014 | Kulkarni et al. .............. 365/154 |

OTHER PUBLICATIONS

Wang Y., et al., "Dynamic Behavior of SRAM Data Retention and a Novel Transient Voltage Collapse Technique for 0.6V 32nm LP SRAM", IEDM11-744 Reference #2, IEEE International, 2011, pp. 741-744.

International Search Report—PCT/US2014/013920—ISA/EPO—Jun. 6, 2014.

* cited by examiner

*Nominal Vdd Condition Writeability*

FIG. 4  Low Vdd Condition Writeability

WRITE DRIVER FOR WRITE ASSISTANCE IN MEMORY DEVICE

BACKGROUND

1. Field

The present disclosure pertains to memory devices with improved writeability of memory cells at low voltage levels.

2. Background

With increased scalability of semiconductor devices, two goals are to make such semiconductor devices more dense and power efficient. Lowering the operating voltage is sometimes used to achieve power efficiency. In the case of memory devices, the lowered voltage may cause reliability issues when writing to memory cells due to unstable behavior of transistors therein.

FIG. 1 illustrates a conventional memory cell 102 comprising a cell core 114 (first inverter 104, and second inverter 106), a first write transistor 108, a second write transistor 110, and a pair of read access transistors 112. FIG. 2 illustrates a detailed implementation of part of the memory cell 102 of FIG. 1. In one example, the memory cell 102 may be a volatile memory.

The cell core 114 may include a first inverter 104, including a first driver transistor 206 (FIG. 2, pull-down transistor) and a first load transistor 208 (pull-up transistor), and a second inverter 106, including a second driver transistor 202 (pull-down transistor) and a second load transistor 204 (pull-up transistor). In this example, the load transistors 204 and 208 (pull-up transistors) are P-channel metal-oxide-silicon (PMOS) transistors and the driver transistors 202 and 206 (pull-down transistors) are N-channel metal-oxide-silicon (NMOS) transistors. The bit cell 102 may be coupled to a write bitline (WBL) 118, a write bitline bar (WBLB) 120, and a write wordline (WWL) 116 that operate together to store one bit of information in the cell core 114. When the write wordline (WWL) 116 is asserted (i.e., goes to a high state), the states at the write bitline (WBL) 118 and the write bitline bar (WBLB) 120 are stored in the cell core 114. The bit cell 102 may also be coupled to a read bitline (RBL) 122 and a read wordline (RWL) 124 that operate together to read one bit of information from the cell core 114. When both the read bitline (RBL) 122 and read wordline (RWL) 124 are asserted (e.g., goes to a high state), a bit is read through the read access transistors 112. In some exemplary implementations, the wordlines WWL 116 and RWL 124, and the bitlines WBL 118, WBLB 120, and RBL 122 may be shared among a plurality of bit cells such that just one bit cell is selected from the plurality of bit cells by a particular combination of wordline and bitline.

The first inverter 104 has its output coupled to the drain of the second write transistor 110 at Node-B. For instance, as illustrated in FIG. 2, the drain of the first load transistor 208, the source of the first driver transistor 206, and the drain of the second write transistor 110 are coupled at Node-B. The gate of the first driver transistor 206 and the gate of the first load transistor 208 are coupled together to the output (i.e., Node-A) of the second inverter 106.

Similarly, the second inverter 106 has its output coupled to the drain of the first write transistor 108 at Node-A. For instance, as illustrated in FIG. 2, the drain of the second load transistor 204, the source of the second driver transistor 202, and the drain of the first write transistor 108 are coupled at Node-A. The gate of the second driver transistor 202 and gate of the second load transistor 204 are coupled together to the output (i.e., Node-B) of the first inverter 104. Thus, in this conventional manner the first inverter 104 and second inverter 106 are cross-coupled, meaning that the output of each inverter is connected to the input of the other, to form the cell core 114 that stores a single bit of information.

The drain of the first write transistor 108 is connected to the output of the second inverter 106 (i.e., Node-A). Similarly, the complimentary second write transistor 110 is coupled to the output of the first inverter 104 (i.e., Node-B). The gates of the second write transistor 110 and first write transistor 108 are each connected to a write wordline (WWL) 116. Together, the second write transistor 110 and the first write transistor 108 form a write circuit that imposes a state on the memory cell 102 in cooperation with the WWL 116, a write bit-line (WBL) 118 and a complementary write bit-line (WBLB) 120.

If the WBL 118 is set to a value of Vdd (logical 1 or high) while the WBLB 120 is set to a value of Vss (logical 0 or low), then, when the WWL 116 is asserted (set to Vdd, high or logical 1), the output Q (Node-A) of the second inverter 106 will be set to a value of Vdd-Vtn, where Vtn is the threshold voltage of the first write transistor 108, while the output Q-Bar (Node-B) of the first inverter 104 will be set to Vss. This is because the second write transistor 110 (e.g., an NMOS transistor) starts in a saturation region of operation and ultimately operates in a linear region when its drain-source voltage Vds=0. The second load transistor 204 (e.g., PMOS) of the second inverter 106 restores Node-A to full Vdd once Node-B reaches Vss.

Conversely, if WBL 118 is set to Vss (logical 0 or low) and WBLB 120 set to Vdd (logical 1 or high), when the WWL 116 is asserted (set to Vdd, high, or logical 1), the output Q (Node-A) of the second inverter 106 will be set to a value of Vss, while the output Q-Bar (Node-B) of the first inverter 104 will be set to Vdd-Vtn, where Vtn is the threshold voltage of the second write transistor 110. The first load transistor 208 (e.g., PMOS) of the first inverter 104 restores Node-B to full Vdd once Node-A reaches Vss.

In the situation in which Node-A is initially at Vdd (e.g., high or logical 1), WBL 118 is set to Vss (logical 0 or low), and WWL 116 is enabled (e.g., Vdd, high or logical 1), writeability of the memory cell 102 of FIG. 1 involves a fight between the first write (NMOS) transistor 108 and the second load (pull-up PMOS) transistor 204. The first write transistor 108 has to be strong enough to cause Node-A to discharge to Vss while the second load transistor 204 is trying to retain Node-A at Vdd (e.g., high or logical 1).

Similarly, in the situation in which Node-B is initially at Vdd (e.g., high or logical 1), WBLB 120 is set to Vss (logical 0 or low), and WWL 116 is enabled (set to Vdd, high, or logical 1), writeability of the memory cell 106 of FIG. 1 involves a fight between the second write transistor 110 and first load transistor 208. The second write transistor 110 has to be strong enough to cause Node-B to discharge to Vss while the second load transistor 204 is trying to retain Node-B at Vdd (e.g., high or logical 1). Hence, the write transistors 108 and 110 are usually stronger than the load (pull-up) transistors 204 and 208.

FIG. 3 illustrates the conditions of writeability for the memory cell 102 of FIGS. 1 & 2 at a nominal Vdd source voltage. These graphs illustrate the conditions at the bitlines WBL 118 and WBLB 120 and outputs Q (Node-A) and Q-Bar (Node-B) during a write operation when the wordline (WWL) 116 is switched from low (e.g., logical 0 or nominal Vss voltage) to high (e.g., logical 1 or nominal Vdd voltage). When the WBL 118 is set to low (e.g., logical 0 or Vss) while the WBLB 120 is set to high (e.g., logical 1 or Vdd), and then the WWL 116 is asserted (set to high, Vdd, or logical 1), the output Q (Node-A) of the second inverter 106 will be set to a value of Vdd (e.g., logical 1 or high), while the output Q-Bar (Node-B) of the first inverter 104 will be set to Vss (e.g., logical 0 or low).

FIG. 4 illustrates the condition of writeability for the memory cell 102 of FIG. 1 at a low source Vdd voltage ($Vdd_{low}$). The low source Vdd voltage ($Vdd_{low}$) may occur, for example, when a device enters a power conservation state in which a lower source voltage is used, when a device uses a lower voltage power source (e.g., a portable or mobile device), and/or when a source voltage from a portable power source (e.g., battery) diminishes (e.g., as the battery drains). For the same write operation illustrated in FIG. 3, but at the lower $Vdd_{low}$ voltage, it can be seen that the outputs Q (Node-A) and Q-Bar (Node-B) may not reach the correct state (i.e., the outputs Q and Q-Bar do not change logical states when the WBL and WBLB change logical states).

Under normal source voltage Vdd, in order to write into the memory cell 102, the write transistors 108 and 110 may be stronger than the load transistors 204 and 208 (pull-up transistors) and/or the write transistors 108 and 110 may be the same strength/size as the driver transistors 202 and 206 (pull-down transistors) of the inverters 104 and 106 in order to write the correct bit.

However, at a low voltage of $Vdd_{low}$ the write transistors 108 and 110 might not be stronger than the load transistors 204 and 208 (pull-up transistors) and/or driver transistors 202 and 206 (pull-down transistors). For instance, at low voltage of $Vdd_{low}$ when a write operation is attempted with WBL=low and WBLB=high, the gate of the first write transistor 108 may be lowered to $Vdd_{low}$ which may just exceed the NMOS threshold voltage Vtn by not more than a few hundred millivolts (mV).

If a low source voltage $Vdd_{low}$ is used at the gate of the first write transistor 108, the gate-to-source voltage Vgs for the first write transistor 108 may be approximately the threshold voltage Vtn, then the resistance across the first write transistor 108 (which is very weakly turned ON) is very high compared to the resistance across the first load transistor 204. Also, when the low source voltage $Vdd_{low}$ is used (e.g., Vgs~Vtn), the current through the first write transistor 108 is very low compared with the current through the first write transistor 108 when typical source voltage Vdd is used. Consequently, the first write transistor 108 cannot drive the voltage at Node-A to low (e.g., Vss or logical 0) because the first load transistor 204 (pull-up transistor) is stronger (e.g., less resistive) than the first write transistor 108. As a result, the stronger first load transistor 204 maintains Node-A (Q) at high (e.g., logical 1 or Vdd) as illustrated in FIG. 4.

Similarly, if a low source voltage $Vdd_{low}$ is used at the gate of the second write transistor 110, the second write transistor 110 may not be able to drive the voltage at Node-B (Q-Bar) high (Vdd or logical 1) because the first driver transistor 206 (pull-down transistor) may be stronger than the second write transistor 110. As a result, the stronger first driver transistor 206 maintains Node-B (Q-Bar) at low (logical 0 or Vss) as illustrated in FIG. 4. Thus, such low voltage conditions may inhibit the proper operation of memory cells.

Consequently, a solution is needed that allows memory cells to operate correctly at lowered voltages.

SUMMARY

A first aspect provides a memory circuit comprising a memory bit cell circuit and a write assist driver circuit coupled to the memory bit cell circuit. Thea memory bit cell circuit may include a bit cell core, a local write bitline (lwbl), a local write bitline bar (lwblb), and/or a local write wordline (lwwl). The write assist driver circuit configured to: (a) provide, in a standby mode of operation, a memory supply voltage VddM to the bit cell core, and/or (b) provide, in a write mode of operation, a lowered memory supply voltage $VddM_{lower}$ to the bit cell core and a selected one of the local write bitline (lwbl) or local write bitline bar (lwblb), wherein VddM is greater than $VddM_{lower}$. The bit cell core may include a first inverter and a second inverter to form a volatile memory bit cell. In some implementations, the memory bit cell and write assist driver circuit may be on the same semiconductor die.

The memory circuit may further include a pair of global write bitlines (gwbl/gwblb) coupled to the write assist driver circuit. The write assist driver circuit may be further configured to pre-charge the pair of global write bitlines to a periphery supply voltage vddP when in the standby mode of operation, wherein VddP is greater than $VddM_{lower}$.

The write assist driver circuit may further include: (a) a memory core head switch transistor, (b) a first switch transistor, (c) a second switch transistor, (d) a third switch transistor, (e) a fourth switch transistor, and/or (f) a fifth switch transistor. The memory core head switch transistor may have a source coupled to an external source voltage Vdde supply and its drain providing the memory supply voltage VddM. The first switch transistor may have its source coupled to the local write bitline (lwbl), its drain coupled to ground, and its gate coupled to a global write bitline (gwbl). The second switch transistor may have its source coupled to the local write bitline bar (lwblb), its drain coupled to ground, and its gate coupled to a global write bitline bar (gwblb). The third switch transistor may have its source coupled to the drain of the memory core head switch, and its gate receives a write enable signal (WEN) signal. The fourth switch transistor may have its drain coupled to the local write bitline (lwbl), and its gate coupled to the global write bitline (gwbl). The fifth switch transistor may have its drain coupled to the local write bitline bar (lwblb), its gate coupled to the global write bitline bar (gwblb), and the source of the fifth switch transistor coupled to the source of the fourth switch transistor and the drain of the third switch transistor.

The write assist driver circuit may be configured to discharge both the local write bitline (lwbl) and local write bitline bar (lwblb) to ground when in the standby mode of operation.

The memory bit cell circuit may include a first write transistor and a second write transistor that are coupled to the bit cell core, the first write transistor is also coupled to the local write bitline (lwbl) and to the local write wordline (lwwl), and the second write transistor is also coupled to the local write bitline bar (lwblb) and to the local write wordline (lwwl).

The write assist driver circuit includes a memory core head switch providing the memory supply voltage VddM and the lowered memory supply voltage $VddM_{lower}$ to the bit cell core depending on whether the standby mode or write mode is invoked.

The write assist driver circuit may include a memory core head switch transistor having a source coupled to external source voltage Vdde and its drain providing the memory supply voltage VddM. The write assist driver circuit may be coupled to a plurality of additional memory bit cell circuits coupled to the same local write bitline (lwbl) and local write bitline bar (lwblb).

The memory circuit may also include a memory cell supply capacitor $C_M$ having a first end coupled to the bit cell core and the drain of the memory core head switch transistor, and a second end of the memory cell supply capacitor $C_M$ coupled to ground. Additionally, the memory circuit may also include a local bitline capacitance $C_{BL}$ that is part of at least one of the local write bitline (lwbl) and the local write bitline bar (lwblb). Upon transitioning from the standby mode to the write mode, charge from the memory cell supply capacitor $C_M$ is shared with the local bitline capacitance $C_{BL}$. A first capacitive value for the memory cell supply capacitor $C_M$ relative to a second capacitive value for the local bitline capacitance $C_{BL}$ may be selected to achieve no more than a maximum voltage droop upon transitioning from the standby mode to the write mode. A gate of the memory core head switch transistor may receive a sleep signal that causes the memory supply voltage VddM to be supplied to the memory bit cell circuit when it is in an active mode.

Another aspect provides a method for write assistance of memory bit cells. A plurality of bit cells may be provided, where each bit cell is coupled to one of a plurality of wordlines and one of a plurality of bitlines, and selection of a particular bitline and wordline combination serves to access one of the plurality of bit cells. A write assist driver circuit is coupled to a first bit cell, the write assist driver circuit providing a source voltage to a bit cell core of the first bit cell and also coupled to at least one local write bitline for the first bit cell. The write assist driver circuit may be configured to provide a first supply voltage VddM to the bit cell core in a first mode of operation and a second supply voltage $VddM_{lower}$ to the bit cell core and the at least one local write bitline in a second mode of operation, where the first supply voltage is greater than the second supply voltage. A pair of global write bitlines may be coupled to the write assist driver circuit, the write assist driver circuit further configured to pre-charge the pair of global write bitlines to a periphery supply voltage vddP when in the standby mode of operation, wherein VddP is greater than VddM. The write assist driver circuit may be configured to discharge both the local write bitline and local write bitline bar to ground when in the standby mode of operation. The memory bit cell circuit may include a first write transistor and a second write transistor that are coupled to the bit cell core, the first write transistor is also coupled to the local write bitline and to the local write wordline, and the second write transistor is also coupled to the local write bitline bar and to the local write wordline. The write assist driver circuit may include a memory core head switch providing the memory supply voltage VddM and the lowered memory supply voltage $VddM_{lower}$ to the bit cell core depending on whether the standby mode or write mode is invoked. The write assist driver circuit may be coupled to a plurality of additional memory bit cell circuits coupled to the same local write bitline (lwbl) and local write bitline bar (lwblb).

A first end of a memory cell supply capacitor $C_M$ may be coupled to the bit cell core and the drain of the memory core head switch transistor, and a second end of the memory cell supply capacitor $C_M$ coupled to ground. At least one of the local write bitline (lwbl) and the local write bitline bar (lwblb) may have a local bitline capacitance $C_{BL}$, where upon transitioning from the standby mode to the write mode, charge from the memory cell supply capacitor $C_M$ is shared with the local bitline capacitance $C_{BL}$. A first capacitive value for the memory cell supply capacitor $C_M$ relative to a second capacitive value for the local bitline capacitance $C_{BL}$ may be selected to achieve no more than a maximum voltage droop upon transitioning from the standby mode to the write mode.

BRIEF DESCRIPTION OF THE DRAWINGS

Various features and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

A write assist driver circuit is provided that assists a memory cell (e.g., volatile memory bit cell) in write operations to keep the voltage at the memory core sufficiently high for correct write operations, even when the supply voltage is lowered. The write assist driver circuit may be configured to provide a memory supply voltage VddM to a bit cell core during a standby mode of operation. In a write mode of operation, the write assist driver circuit may provide a lowered memory supply voltage $Vdd_{lower}$ to the bit cell core as well as to at least one of the local write bitline (lwbl) and local write bitline bar (lwblb). Additionally, the write assist driver circuit may also provide a periphery supply voltage VddP to a local write wordline (lwwl), where $VddP \geq VddM > VddM_{lower}$.

Exemplary Local Write Driver for Memory Cells

Figure 5:
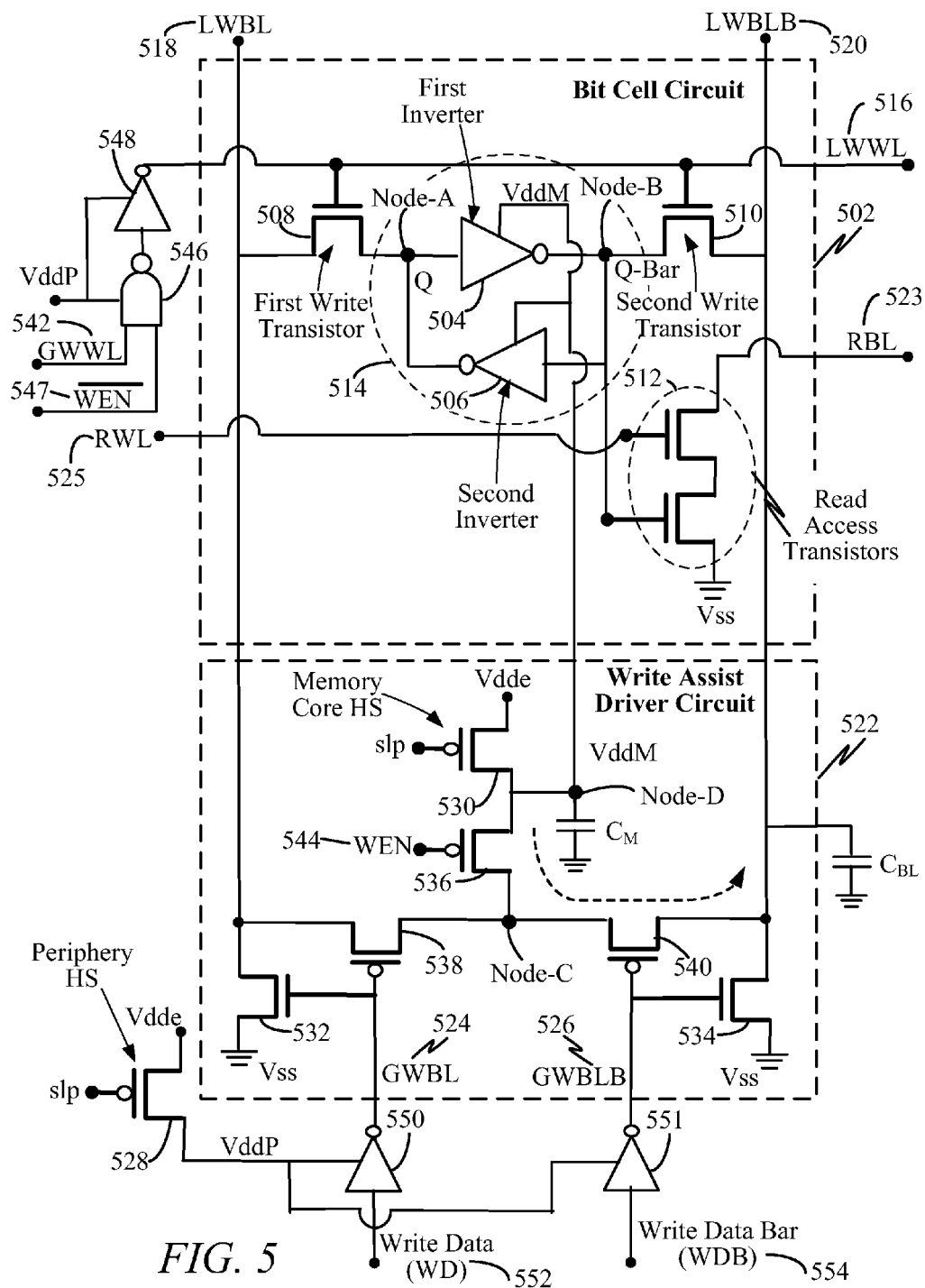
FIG. 5 illustrates an improved memory cell circuit having a local write assist driver circuit that assists a memory bit cell circuit during memory write operations.
Figure 6:
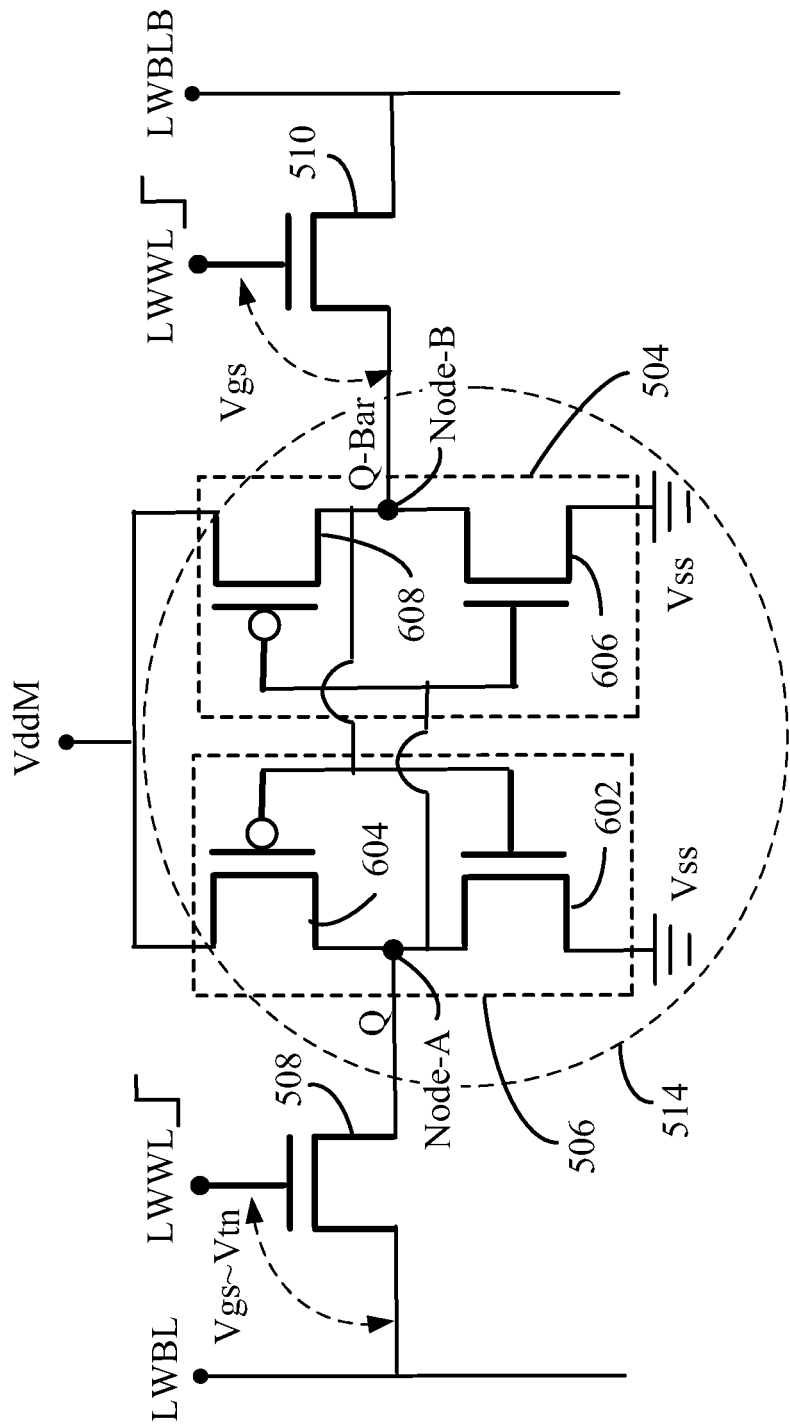
FIG. 6 illustrates a detailed implementation of part of the memory cell of FIG. 5.

FIG. 5 illustrates an improved memory circuit having a local write assist driver circuit 522 that assists a memory bit cell circuit 502 during memory write operations. FIG. 6 illustrates a detailed implementation of part of the memory cell of FIG. 5.

Figure 1:
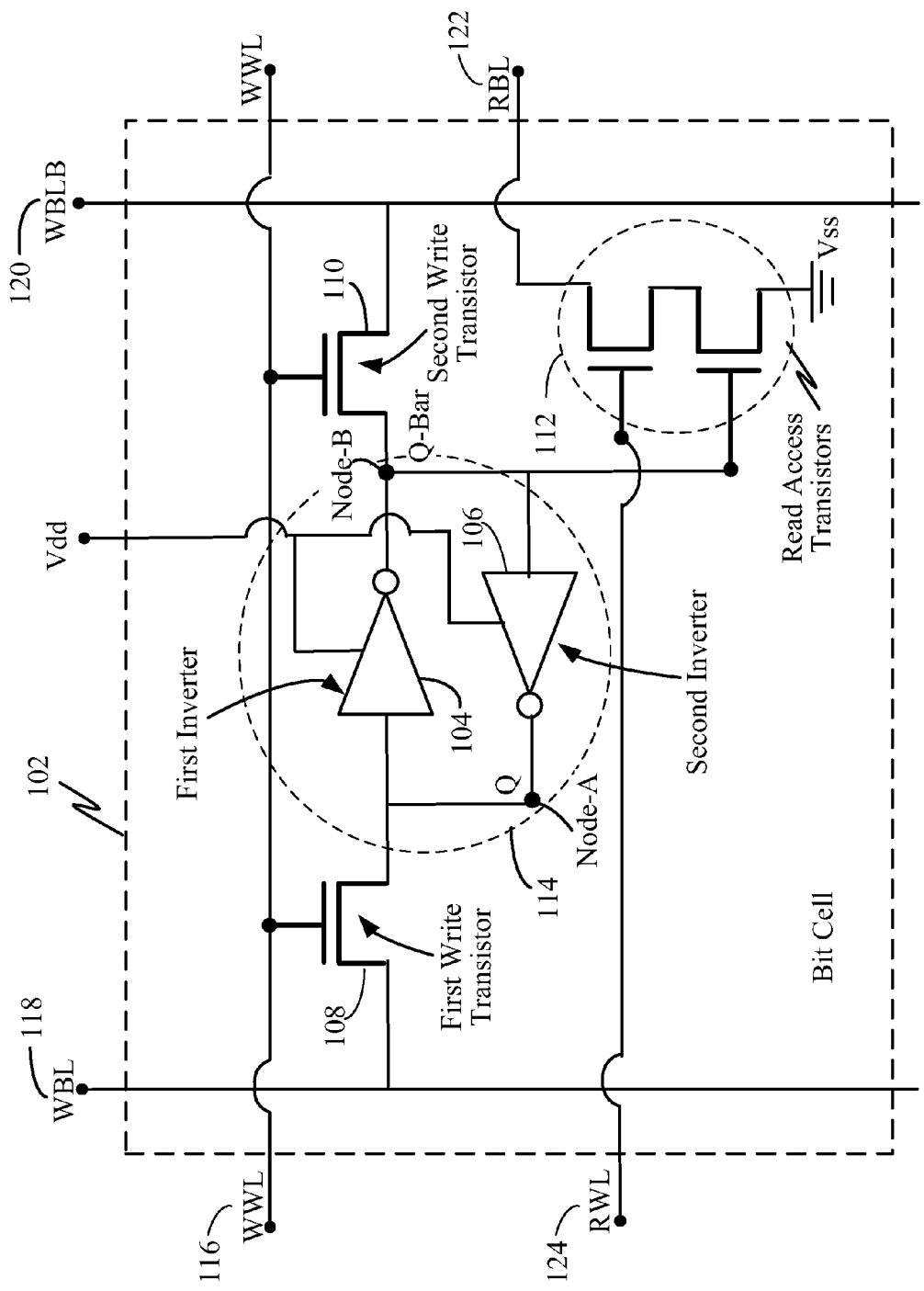
FIG. 1 illustrates a conventional memory cell comprising a cell core, a first write transistor, a second write transistor, and a pair of read access transistors.

Like in FIG. 1, the memory cell circuit 502 includes a cell core 514 (first inverter 504, and second inverter 506), a first write transistor 508, a second write transistor 510, and a pair of read access transistors 512. The cell core 514 may include a first inverter 504, including a first driver transistor 606 (FIG. 6, pull-down transistor) and a first load transistor 608 (pull-up transistor), and a second inverter 506, including a second driver transistor 602 (pull-down transistor) and a second load transistor 604 (pull-up transistor). In one example, the memory bit cell circuit 502 and/or cell core 514 may be volatile memory (e.g., dynamic memory, non-static memory).

Figure 2:
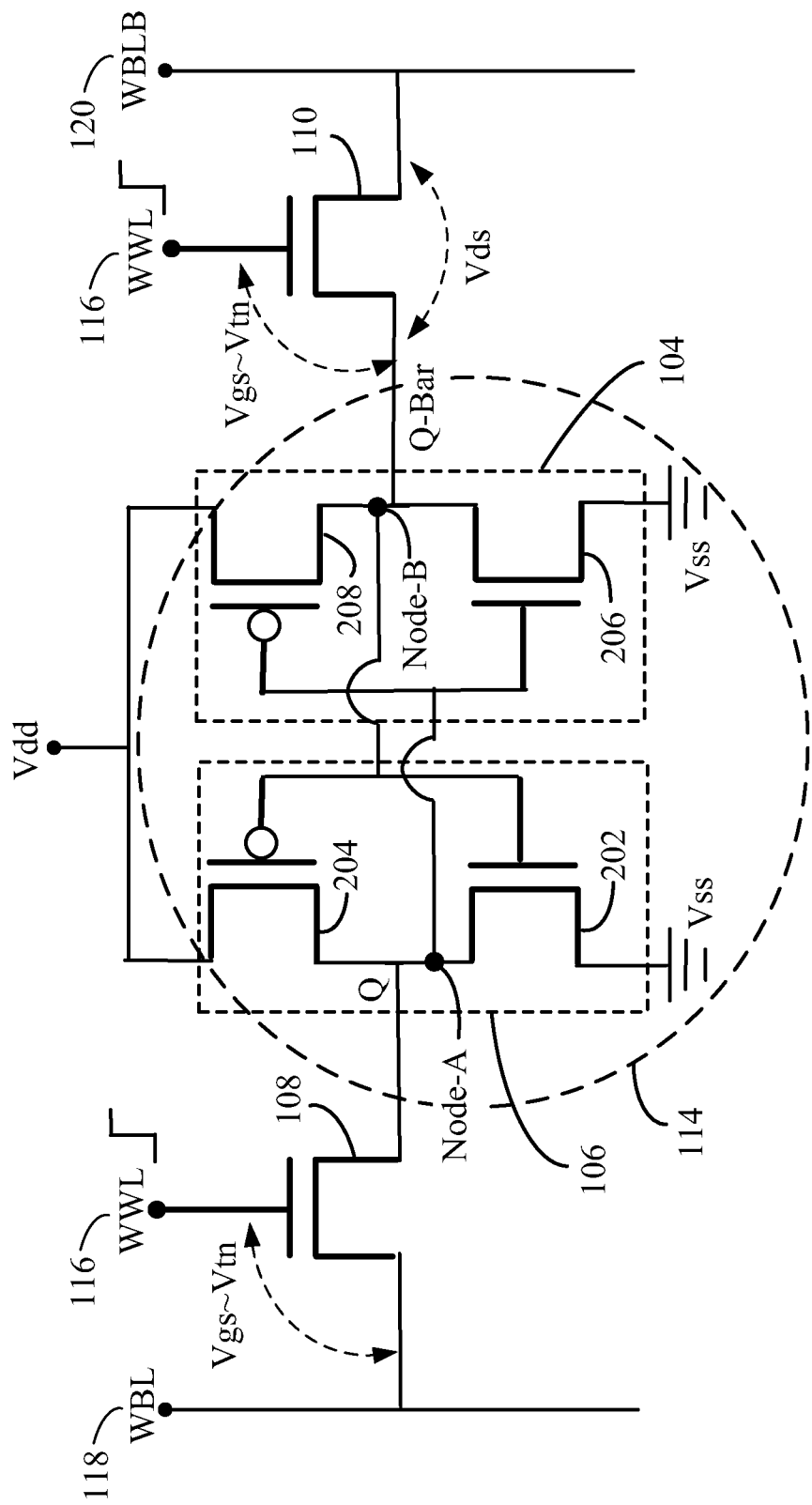
FIG. 2 illustrates a detailed implementation of part of the memory cell of FIG. 1.
Figure 3:
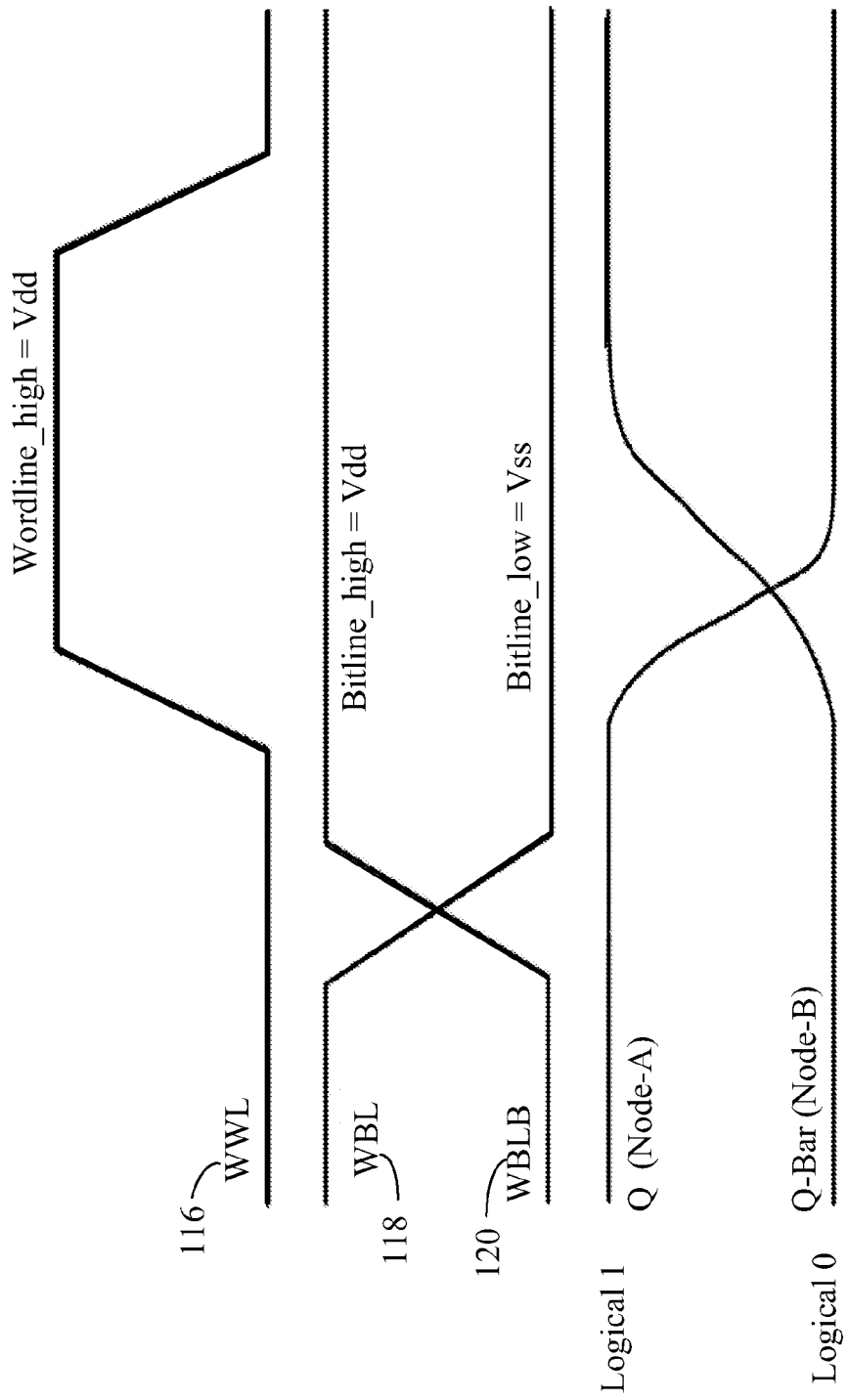
FIG. 3 illustrates the conditions of writeability for the memory cell of FIGS. 1 & 2 at a nominal Vdd source voltage.
Figure 4:
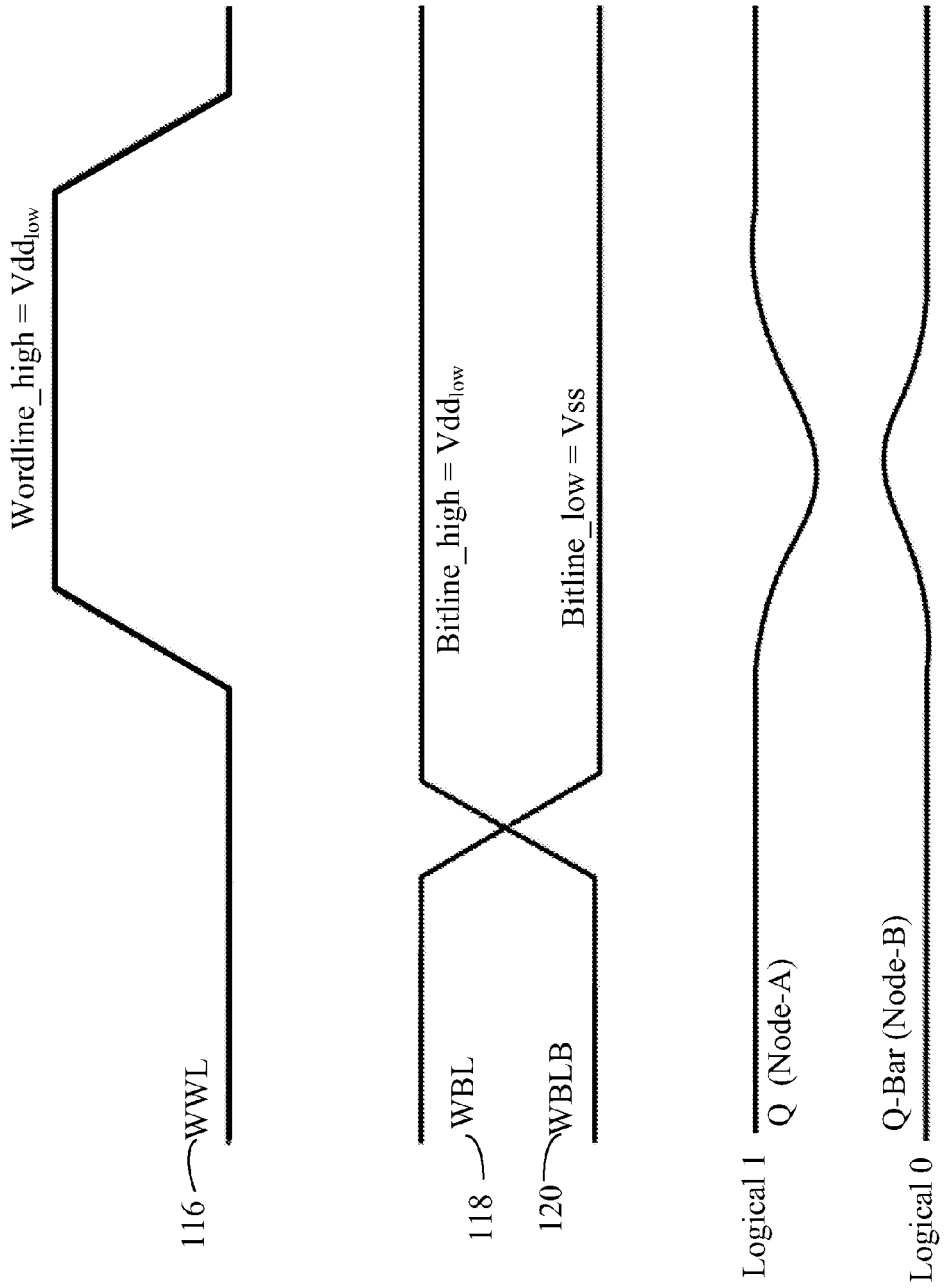
FIG. 4 illustrates the condition of writeability for the memory cell of FIG. 1 at a low source Vdd voltage ($Vdd_{low}$).

In contrast to the bit cell 102 of FIGS. 1 and 2 in which the wordlines WWL 116 and RWL 124, and the bitlines WBL 118, WBLB 120, and RBL 122 may be shared among a plurality of bit cells, the bit cell circuit 502 of FIGS. 5 and 6 may utilize a localized write wordline (LWWL) 516 and localized write bitlines LWBL 518 and LWBLB 520. These localized write wordline (LWWL) 516 and localized write bitlines LWBL 518 and LWBLB 520 may extend between the write assist driver circuit 522 and the bit cell circuit 502.

The bit cell circuit 502 may be coupled to the local write bitline (LWBL) 518, the local write bitline bar (WBLB) 520, and the local write wordline (LWWL) 516 that operate together to store one bit of information in the cell core 514. When the local write wordline (LWWL) 516 is asserted (i.e., goes to a high state), the states at the local write bitline (LWBL) 518 and the local write bitline bar (WBLB) 520 are stored in the cell core 514. The bit cell circuit 502 may also be coupled to a read bitline (RBL) 523 and a read wordline (RWL) 525 that operate together to read one bit of information from the cell core 514. When both the read bitline (RBL) 523 and read wordline (RWL) 525 are asserted (e.g., goes to a high state), a bit is read through the read access transistors 512.

In some exemplary implementations, the local write wordline LWWL 516, and the local bitlines LWBL 518 and LWBLB 520 may be shared among, and/or coupled to, a plurality of memory bit cell circuits 502. A global write wordline (GWWL) 542, a global write bitline (GWBL) 524, and/or a global write bitline bar (GWBLB) 526 may be used for a plurality of different bit cells. In the example of FIG. 5, the global write wordline (GWWL) 542 is coupled to an input enabling circuit comprising a NAND gate 546 and an inverter 548, where the output of the inverter 548 is the local write wordline (LWWL) 516. Along with the GWWL 542, the NAND gate 546 also receives a write enable (WEN) 544 input.

The write assist driver circuit 522 may include a memory core head switch transistor 530 that provides a voltage VddM to the memory cell core 514. The write assist driver circuit 522 comprises a first switch transistor 532, a second switch transistor 534, a third switch transistor 536, a fourth switch transistor 538, and a fifth switch transistor 540. In some implementations, at least the memory core head switch transistor 530, the third switch transistor 536, the fourth switch transistor 538, and/or the fifth switch transistor 540 may be PMOS transistors.

The memory core head switch transistor 530 has its source coupled to an external source voltage Vdde, its drain coupled to the source of the third switch transistor 536, and its gate to a sleep (slp) signal. In one example, sleep (slp) is deasserted (slp=0), when the memory is in active mode (i.e., either a read or write operation is going on). The sleep signal (slp) is asserted (slp=1) to reduce the leakage when not in active mode (i.e., sleep mode). The third switch transistor 536 has its gate coupled to a write enable signal (WEN) signal and its drain coupled to the sources of the fourth switch transistor 538 and fifth switch transistor 540 at a Node-C. The fourth switch transistor 538 has its drain coupled to the LWBL 518 and its gate coupled to the global write bitline (GWBL) 524. Similarly, the fifth switch transistor 540 has its drain coupled to the LWBLB 520 and its gate coupled to the global write bitline bar (GWBLB) 526. The first switch transistor 532 has its source coupled to the LWBL 518, its drain coupled to Vss (e.g., ground), and its gate to the GWBL 524. Similarly, the second switch transistor 534 has its source coupled to the LWBLB 520, its drain coupled to Vss (e.g., ground), and its gate to the GWBLB 526. A first inverter 550 receives a write data (WD) signal and outputs the GWBL 524. A second inverter 551 receives a write data bar (WDB) signal 554 and outputs the GWBLB 526. The first and second inverters 550 and 551 are powered from a periphery source voltage VddP provided by a periphery head switch 528 which has its source coupled to an external voltage source Vdde and its gate to the sleep (slp) signal.

Relative to the typical bit cell of FIGS. 1 and 2, the wordline LWWL 516 and bitlines LWBL 518 and LWBLB 520 for the bit cell circuit 502 have been localized such that the voltage supply VddM for the memory cell core 514 is separate from the periphery voltage supply VddP (e.g., nominal supply) used for the wordline LWWL 516 and the local write bitlines LWLB 518 and LWBLB 520.

In this exemplary write assist driver circuit 522, a memory cell supply capacitor $C_M$ is coupled at Node-D between the memory core voltage VddM for the cell core 514 and ground. In one example, the capacitor $C_M$ is larger than the capacitance $C_{BL}$. As the magnitude of the voltage droop ΔV depends on the ratio of these capacitances, capacitor $C_M$ cannot be too large (leads to low ΔV) and neither can it be too low (leads to high ΔV and can cause data retention issues in the non-selected memory cells).

In a Standby Mode, the global write bitlines (GWBL/GWBLB) 524 and 526 are pre-charged to a voltage VddP (both global write bitlines are High—not shown in FIG. 7) from the periphery head switch 528 while the WD 552 and WDB 554 signals are set low. The write enable signal WEN to the third switch transistor 536 is high so that transistors 538 and 540 have high resistance. In this mode, the local write bitlines LWBL 518 and LWBLB 520 are discharged to ground via the first switch transistor 532 and a second switch transistor 534, respectively. That is, the WD and WDB signals are both set low which causes the global write bitlines GWBL 524 and GWBLB 526 to be high, and consequently the local write bitlines LWBL 518 and LWBLB 520 are discharged or set to low.

Figure 7:
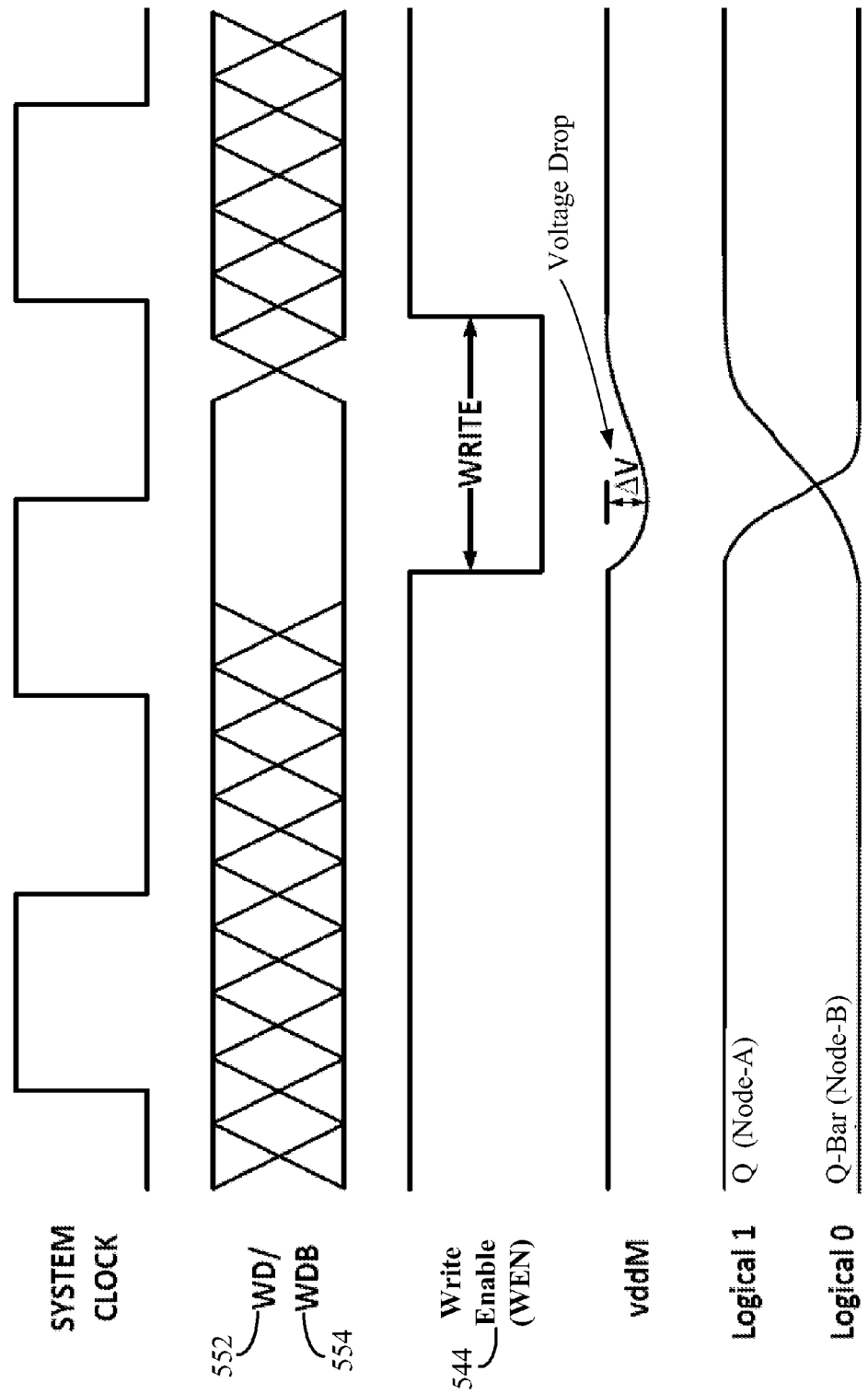
FIG. 7 illustrates the conditions of writeability for a write driver assist circuit for a bit cell.

In Write Mode, at the beginning of the write cycle, one of the GWBL 524 or the GWBLB 526 is pulled low and the other global write bitline stays high and then the complement write enable ($\overline{\text{WEN}}$) signal 547 is activated low. The weak (high resistance) memory core head switch 530, which is separate from the periphery head switch 528, may be shared across multiple local write drivers (e.g., cell core transistors 604 and 608 and write driver transistors 538 and 540). When the WEN signal goes low, a voltage VddM is supplied to the cell core 514 as well as one of the local bitlines LWBL 518 or LWBLB 520. As illustrated in FIG. 7, because during this write cycle the WEN signal causes the memory core voltage VddM to be shared between the cell core 514 one of the local bitlines LWBL 518 or LWBLB 520, the memory supply voltage VddM has a voltage droop ΔV (e.g., a voltage drop). The voltage droop ΔV (of the memory supply voltage VddM) occurs because the charge that is stored in the memory cell supply capacitor $C_M$ at the beginning of a write cycle (when WEN signal is high), is shared between $C_M$ and a selected one of the local bitlines LWBL 518 or LWBLB 520 when the WEN signal goes low. The magnitude or extent of the voltage droop ΔV may depend on the ratio or relative capacitive values between the memory cell supply capacitor $C_M$ and the capacitance $C_{BL}$ of the selected local bitline (i.e., the capacitance of either LWBL 518 or LWBLB 520). Note that while the capacitance $C_{BL}$ of the selected local bitline is illustrated as discrete component, it actually represents a capacitance of the bitline (e.g., capacitance distributed along the bitline).

This voltage droop ΔV dynamically changes over time due to charge redistribution occurring between capacitor $C_M$ and the selected local bitline. After the initial loss of charge from the memory cell supply capacitor $C_M$, the head switch transistor 530 replenishes some of the lost charge on the memory cell supply capacitor $C_M$ thereby preventing the memory core supply voltage VddM level from going too low and causing retention issues. The voltage drop (ΔV) of the memory core supply voltage VddM depends on the relative values of capacitor $C_M$ and the capacitance $C_{BL}$ of the selected local bitline, and also on the size of head switch transistor 530, and the transistor switches 536 and 540 (or 538).

Writeability is improved by the combination of following two effects: (a) reduced/lowered supply voltage VddM$_{lower}$ at the memory (bit) cell core 514 due to charge redistribution between the memory cell supply capacitor $C_M$ and the selected local bitline capacitance $C_{BL}$, and (b) the supply voltage on the local bitlines LWBL 518 or LWBLB that rises to the same value, VddM$_{lower}$. In one example, VddM$_{lower}$ may refer to VddM at a maximum voltage droop ΔV. The reduced memory core supply voltage VddM$_{lower}$ at the cell core 514 causes the cell core transistors 604 and 608 to be turned On very weakly compared to the first and second write transistors 508 and 510, which are turned On by voltage VddP via LWWL 516 (where VddP is larger than VddM$_{lower}$).

The dynamic power consumed in this write assist memory circuit is very small because, except for the charge provided by the memory core head switch 530 to restore and sustain the VddM level, there is no extra charge being sourced from power supply Vdde or being sinked to ground. The charge is simply being redistributed between the memory cell supply capacitor $C_M$ and the selected local bitline capacitance. Consequently, the write assist driver circuit described herein involves a small amount of power dissipation. By contrast, alternative write assist driver circuits that may rely on a NMOS or PMOS switch that receives a pulsed input to reduce a memory core power supply voltage for a short duration during the write cycle may add dynamic power consumption and timing complexity.

In one example, a memory circuit is provided comprising a memory bit cell circuit (e.g., bit cell circuit 502) and a write assist driver circuit (e.g., local write assist driver circuit 522). The memory bit cell circuit may include a first inverter and a second inverter forming a bit cell core, a local write bitline (LWBL) and a local write bitline bar (LWBLB), and a local write wordline (LWWL). The write assist driver circuit is coupled to the memory bit cell circuit and is configured to operate in a standby mode or a write mode. In the standby mode of operation, the write assist driver circuit provides a memory supply voltage VddM to the first and second inverters. In the write mode of operation, the write assist driver circuit provides a lowered memory supply voltage VddM$_{lower}$ to the first and second inverters as well as to at least one of the local write bitline (LWBL) and local write bitline bar (LWBLB), while providing a periphery supply voltage VddP to the local write wordline (LWWL), where VddP≥VddM>VddM$_{lower}$. In the standby mode, a pair of global write bitlines (GWBL/GWBLB) into the write assist driver circuit are pre-charged to the periphery supply voltage vddP. In the standby mode, the write assist driver circuit discharges both the local write bitline (LWBL) and local write bitline bar (LWBLB) to ground.

The memory bit cell circuit may include a first write transistor and a second write transistor that are coupled to the bit cell core, the first write transistor is also coupled to the local write bitline (LWBL) and the local write wordline (LWWL), and the second write transistor is also coupled to the local write bitline bar (LWBLB) and the local write wordline (LWWL).

The write assist driver circuit may include a memory core head switch (e.g., core head switch transistor 530) separate from a periphery head switch transistor (e.g., periphery head switch transistor 528) and a combination of the write-enable switch transistor (536) and a local write bitline switch transistor (540 or 538) that selectively provide either the memory supply voltage VddM and the lowered memory supply voltage VddM$_{lower}$ depending on whether the standby mode or write mode is invoked.

Figure 8:
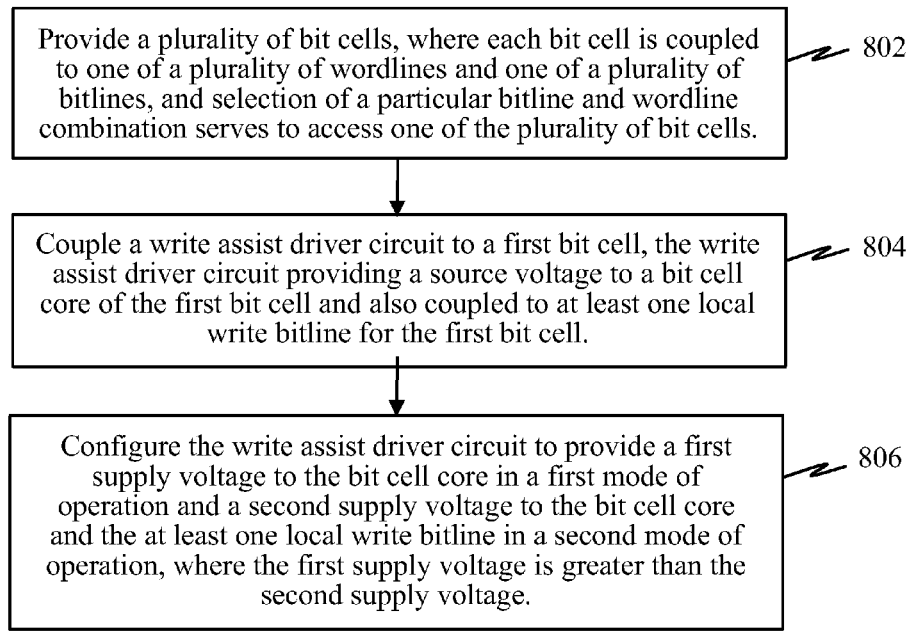
FIG. 8 illustrates a method of providing write assistance to a memory bit cell.

FIG. 8 illustrates a method of providing write assistance to a memory bit cell. A plurality of bit cells are provide (e.g., within a memory device), where each bit cell is coupled to one of a plurality of wordlines and one of a plurality of bitlines, and selection of a particular bitline and wordline combination serves to access one of the plurality of bit cells 802. A write assist driver circuit is coupled to a first bit cell, the write assist driver circuit providing a source voltage to a core cell of the first bit cell and also to at least one local write bitline for the first bit cell 804. The write assist driver circuit may be adapted or configured to provide a first supply voltage to the core cell in a first mode of operation and a second supply voltage to the core cell and the at least one local write bitline in a second mode of operation, where the first supply voltage is greater than the second supply voltage 806. A third supply voltage may be provided to at least one local write wordline for the first cell in the second mode of operation, where the third supply voltage is greater than the second supply voltage.

Figure 9:
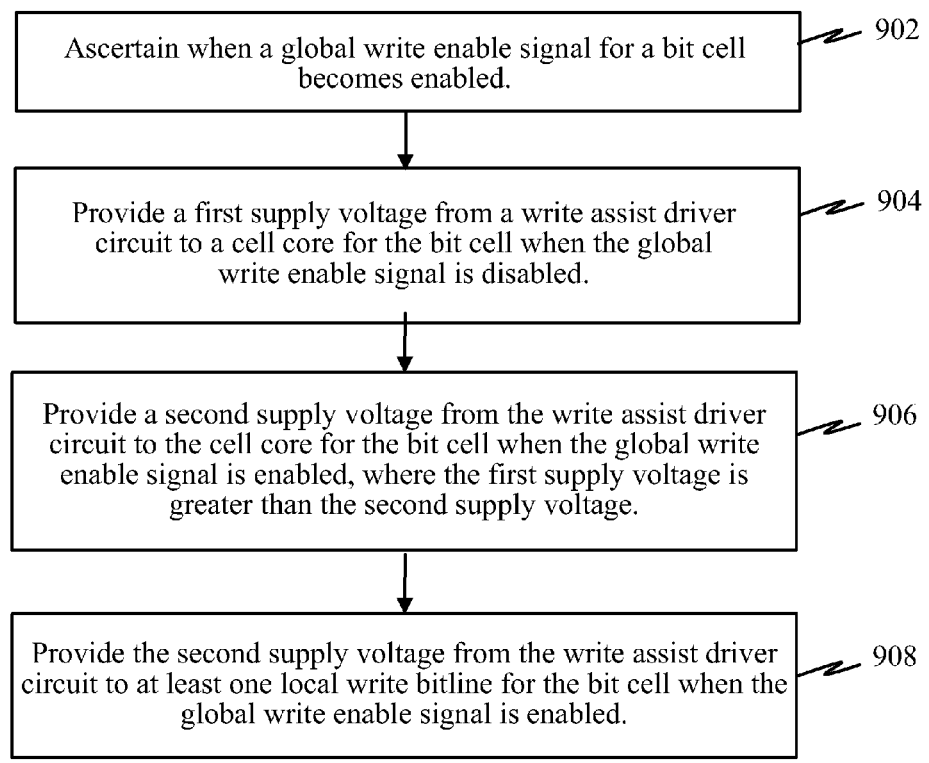
FIG. 9 illustrates a method of operating a write assist driver circuit for a memory bit cell.

FIG. 9 illustrates a method of operating a write assist driver circuit for a memory bit cell. The write assist driver circuit ascertains the occurrence of a write enable signal for the memory bit cell 902. A first supply voltage may be provided from the write assist driver circuit to a cell core for the bit cell when the global write enable signal is disabled 904. A second supply voltage may be provided from the write assist driver circuit to the cell core for the bit cell when the global write enable signal is enabled, where the first supply voltage is greater than the second supply voltage 906. The second supply voltage may also be provided from the write assist driver circuit to at least one local write bitline for the bit cell when the global write enable signal is enabled 908. In some examples, a third supply voltage may be provided to the at least one local write wordline for the first cell in the second mode of operation, where the third supply voltage is greater than the second supply voltage.

Figure 10:
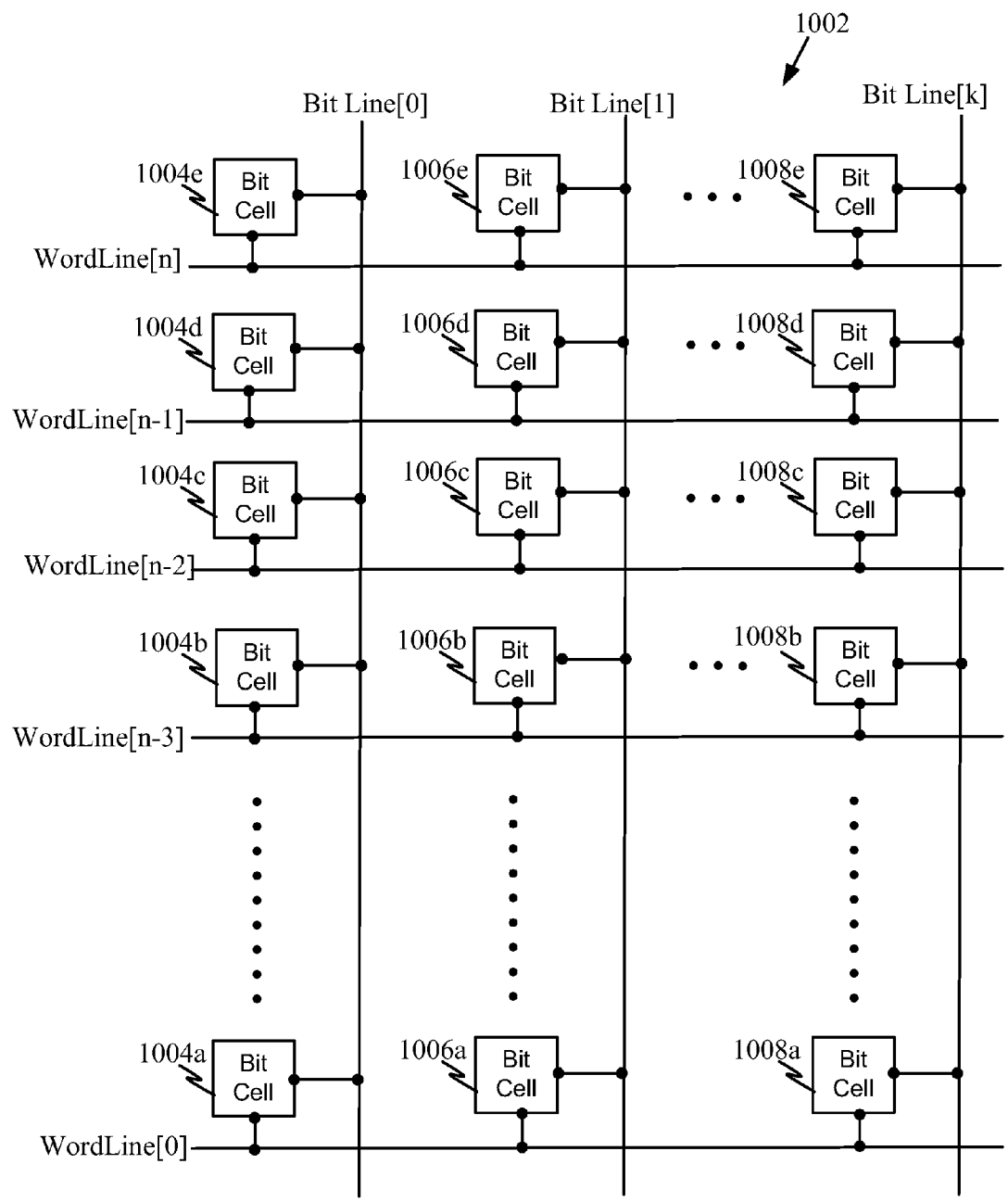
FIG. 10 illustrates a memory circuit comprising a plurality of bit cells.

FIG. 10 illustrates a memory circuit comprising a plurality of bit cells 1004a-e, 1006-e, and 1008a-e. In one example, a write assist driver circuit (e.g., write assist driver circuit 522 in FIG. 5). may be coupled to a plurality of bit cells along a wordline and/or a bitline.

In various implementations, the write assist driver circuit may be employed with various types of memory devices, including register file memory devices, volatile memory devices, and memory cells. In one example, the write assist driver circuit may be part of memory chips, semiconductor devices, and/or integrated memory that is part a processor, processing circuit, and/or system on a chip.

One or more of the components, steps, features and/or functions illustrated in the FIGS. may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGS. may be configured to perform one or more of the methods, features, or steps described in the FIGS.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

The various illustrative logical blocks, modules, circuits, elements, and/or components described in connection with the examples disclosed herein may be implemented or performed within a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine.

The methods described in connection with the examples disclosed herein may be embodied directly in hardware contained in a single device or distributed across multiple devices. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A memory circuit, comprising:
    a memory bit cell circuit including a bit cell core, a local write bitline, a local write bitline bar, and a local power supply node for providing power to the bit cell core;
    a memory cell supply capacitor configured to capacitively load the local power supply node;
    a write assist driver circuit, the write assist driver circuit including:
        a head switch configured to couple the local power supply node to a global power supply node;
        a first switch configured to couple the local power supply node to the local write bitline responsive to a write bit to be written to the bit cell core having a logic high value; and
        a second switch configured to couple the local power node to the local write bitline bar responsive to the write bit to be written to the bit cell core having a logic low value, and wherein a capacitance for the memory cell supply capacitor is greater than a distributed capacitance for either of the local write bitline or the local write bitline bar.

2. The memory circuit of claim 1, wherein the bit cell core includes a first inverter and a second inverter to form a volatile memory bit cell.

3. The memory circuit of claim 1, further comprising:
    a pair of global write bitlines coupled to the write assist driver circuit, the write assist driver circuit further configured to pre-charge the pair of global write bitlines to a periphery supply voltage VddP when in the standby mode of operation.

4. The memory circuit of claim 3, wherein the
    head switch comprises a head switch transistor having a source coupled to the global power supply node and a drain coupled to the local power supply node;
    the write assist circuit further including a write enable transistor having its source coupled to the drain of the head switch transistor, and a gate configured to receive a write enable signal (WEN) signal;
    and wherein the first switch comprises a first switch transistor having its drain coupled to the local write bitline, a source coupled to a drain of the write enable transistor, and its gate coupled to the global write bitline; and
    the second switch comprises a second switch transistor having its drain coupled to the local write bitline bar, a gate coupled to the global write bitline bar, and a source coupled to the drain of the write enable switch transistor.

5. The memory device of claim 1, wherein the write assist driver circuit is configured to discharge both the local write bitline and local write bitline bar to ground when in the standby mode of operation.

6. The memory circuit of claim 1, wherein the memory bit cell circuit includes a first write transistor and a second write transistor that are coupled to the bit cell core, the first write transistor is also coupled to the local write bitline and to a local write wordline, and the second write transistor is also coupled to the local write bitline bar and to the local write wordline.

7. The memory circuit of claim 4, wherein a gate of the head switch transistor is configured to receive a sleep signal.

8. The memory circuit of claim 1, wherein the memory bit cell and write assist driver circuit are on a first semiconductor die.

9. The memory circuit of claim 1, wherein the write assist driver circuit is coupled to a plurality of additional memory bit cell circuits coupled to the same local write bitline and local write bitline bar.

10. A method for write assistance, comprising:
    during a standby mode of operation for a memory cell powered by a local power supply node that is tied to a memory cell supply capacitor, coupling the local power supply node and the memory cell supply capacitor to a global power supply node to charge the local power supply node and the memory cell supply capacitor to a power supply voltage VddM;
    during a write mode of operation for the memory cell in which one of a local write bitline and a local write bitline bar for the memory cell is asserted to a logic high state while a remaining one of the local write bitline and the local write bitline bar is maintained at a logic low state, coupling the charged local power supply node and the charged memory cell capacitor to the asserted one of the local write bitline and the local write bitline bar to share charge between the memory cell supply capacitor and the asserted one of the local write bitline and the local write bitline bar so that a voltage for the local power supply node and the asserted one of the local write bitline and the local write bitline bar temporarily drops below the power supply voltage VddM.

11. The method of claim 10, wherein coupling the charged local power supply node and the charged memory cell capacitor to the asserted one of the local write bitline and the local write bitline bar comprising switching on a switch from a pair of switches responsive to an assertion of one of a global write bitline and a global write bitline bar.

12. The method of claim 10, further comprising discharging both the local write bitline and local write bitline bar to ground when in the first mode of operation.

* * * * *